United States Patent
Chen

(10) Patent No.: US 7,544,971 B2
(45) Date of Patent: Jun. 9, 2009

(54) LATERAL CURRENT BLOCKING LIGHT-EMITTING DIODE AND METHOD FOR MANUFACTURING THE SAME

(75) Inventor: Shi-Ming Chen, Tainan (TW)

(73) Assignee: Epistar Corporation, Hsinchu (TW)

( * ) Notice: Subject to any disclaimer, the term of this patent is extended or adjusted under 35 U.S.C. 154(b) by 130 days.

(21) Appl. No.: 11/226,828

(22) Filed: Sep. 14, 2005

(65) Prior Publication Data

US 2006/0244005 A1 Nov. 2, 2006

(30) Foreign Application Priority Data

Apr. 28, 2005 (TW) .............................. 94113734 A

(51) Int. Cl.
*H01L 27/15* (2006.01)
(52) U.S. Cl. .............................. 257/80; 257/90; 257/91; 257/95; 257/98; 438/46; 438/47
(58) Field of Classification Search .................. 257/80, 257/90, 91, 95, 98; 438/46, 47
See application file for complete search history.

(56) References Cited

U.S. PATENT DOCUMENTS 5,612,231 A * 3/1997 Holm et al. .................... 438/23

6,445,007 B1 * 9/2002 Wu et al. ...................... 257/80
2005/0156189 A1 * 7/2005 Deguchi et al. ............. 257/103

* cited by examiner

*Primary Examiner*—Long Pham
(74) *Attorney, Agent, or Firm*—Winston Hsu

(57) ABSTRACT

A lateral current blocking light-emitting diode and a method for manufacturing the same are disclosed. The light-emitting diode comprises an insulating substrate, a semiconductor epitaxial structure and electrodes of different conductivity types. The semiconductor epitaxial structure has at least one trench and comprises a first conductivity type semiconductor layer deposed on a portion of the insulating substrate, in which a bottom of the trench is beneath the first conductivity type semiconductor layer, an active layer located on a portion of the first conductivity type semiconductor layer, and a second conductivity type semiconductor layer deposed on the active layer. A first conductivity type electrode is deposed on the exposed portion of the first conductivity type semiconductor layer, and a second conductivity type electrode is deposed on a portion of the second conductivity type semiconductor layer, in which the trench covers the shortest conductive path between the first conductivity type electrode and the second conductivity type electrode, so as to block the current between the first conductivity type electrode and the second conductivity type electrode from flowing through the shortest conductive path.

19 Claims, 6 Drawing Sheets

LATERAL CURRENT BLOCKING LIGHT-EMITTING DIODE AND METHOD FOR MANUFACTURING THE SAME

RELATED APPLICATIONS

The present application is based on, and claims priority from, Taiwan Application Serial Number 94113734, filed Apr. 28, 2005, the disclosure of which is hereby incorporated by reference herein in its entirety.

FIELD OF THE INVENTION

The present invention relates to a light-emitting diode and a method of manufacturing the same, and more particularly, to a lateral current blocking light-emitting diode and a method for manufacturing the same, which are especially suitable for the application of high-power light-emitting diodes.

BACKGROUND OF THE INVENTION

In the fabrication of light-emitting diodes, III-nitride-based semiconductors, such as GaN, AlGaN, InGaN and AlInGaN, are common. Usually, epitaxial structures of most of the light-emitting devices made of the III-nitride-based semiconductors are grown on an electrically insulating sapphire substrate, which is different from other light-emitting devices utilizing conductive substrates. The sapphire substrate is an insulator, so an electrode cannot be directly formed on the sapphire substrate. Electrodes have to be formed to contact respectively a p-type semiconductor layer and an n-type semiconductor layer directly, so that the light-emitting devices of the aforementioned type can be completed.

Referring to FIGS. 1(a) and 1(b), FIG. 1(a) illustrates a top view of a conventional light-emitting diode chip, and FIG. 1(b) illustrates a cross-sectional view of the light-emitting diode chip along the cross-sectional line B-B' shown in FIG. 1(a). The conventional light-emitting diode 200 is mainly composed of a transparent substrate 202, an epitaxial structure located on the transparent substrate 202 and two electrodes, in which the epitaxial structure principally includes a first conductivity type semiconductor layer 204, an active layer 206 and a second conductivity type semiconductor layer 208 stacked in sequence. The first conductivity type semiconductor layer 204 is deposed on the transparent substrate 202, the active layer 206 is deposed on a portion of the first conductivity type semiconductor layer 204 to expose the other portion of the first conductivity type semiconductor layer 204, and the second conductivity type semiconductor layer 208 is deposed on the active layer 206. A transparent conductive layer 210 is provided on a portion of the second conductivity type semiconductor layer 208 for the improvement of current spreading. A second conductivity type electrode pad 212 is deposed on the exposed portion of the second conductivity type semiconductor layer 208 and a portion of the transparent conductive layer 210, and a stacked structure composed of a first conductivity type electrode 214 and a first conductivity type electrode pad 216 is deposed on a portion of the exposed portion of the first conductivity type semiconductor layer 204, such as shown in FIG. 1(b).

With respect to the structure illustrated in FIG. 1(b), when an area of the first conductivity type semiconductor layer 204 is exposed by removing a portion of the epitaxial structure for deposing the first conductivity type electrode 214 and the first conductivity type electrode pad 216, an etching process is performed and stopped at the first conductivity type semiconductor layer 204. The conventional light-emitting diode 200 cannot spread current because the two electrode structures of the light-emitting diode 200 are typically on the diagonal line of the light-emitting diode chip, which easily causes excessive current density in a local area. Accordingly, when the operating current is increased, because the current distribution between the first conductivity type electrode pad 216 and the second conductivity type electrode pad 212 is not uniform, the region A of the light-emitting diode 200 shown in FIG. 1(a) is easily damaged or the efficiency of the light-emitting diode 200 is reduced by the excessive current density.

In order to improve the aforementioned issue of the conventional light-emitting diode structure, a light-emitting diode 300 such as illustrated in FIG. 2 is provided in U.S. Pat. No. 6,307,218 by Lumileds of the United States of America. A first conductivity type electrode 304 of the light-emitting diode 300 is deposed on the exposed portion of a first conductivity type semiconductor layer 302, a second conductivity type electrode 308 is deposed on a transparent electrode 306, and most of the first conductivity type electrode 304 and the second conductivity type electrode 308 are parallel to improve the distribution of current. Although the light-emitting diode 300 has parallel electrodes, current cannot be uniformly spread at the electrode edges, such as at a region B and a region C.

For example, if the light-emitting diode shown in FIG. 1(b) is a green light LED (having a wavelength of 525 nm) 14 mil long×14 mil wide, the efficiency of the LED is 50 lm/W; if the green LED is 40 mil long×40 mil wide and is designed as the structure shown in FIG. 2, the efficiency of the LED is lowered to 35 lm/W. As the dimensions are decreased, the efficiency of the LED is decreased, as shown in FIG. 3. Therefore, the parallel electrodes cannot enhance the uniformity of current effectively.

Accordingly, because electrodes of a conventional light-emitting diode are usually deposed on the diagonal line of the light-emitting diode chip, and the etching process used to remove a portion of the epitaxial structure is typically stopped at the first conductivity type semiconductor layer, excessive current density in the local area is easily caused. Particularly, when the light-emitting diode is operated at high power, the area within the shortest path between electrodes is easily damaged by the excessively concentrated current, and the efficiency of the light-emitting diode is decreased with increasing operating power. Accordingly, it is desirable to provide a light-emitting diode without the above shortcomings.

SUMMARY OF THE INVENTION

Therefore, one objective of the present invention is to provide a lateral current blocking light-emitting diode, which includes at least one trench to form electrical insulation, so that the conductive path of injecting current can be restricted for spreading current. Accordingly, the present light-emitting diode has an advantage of highly uniform current, which greatly enhances the efficiency of the light-emitting diode.

Another objective of the present invention is to provide a lateral current blocking light-emitting diode, in which one or more trenches are formed between electrodes of two different conductivity types to adjust one or more conductive paths of injecting current, such that the current between the electrodes can be uniformly distributed, and the illuminant efficiency decay of the light-emitting diode caused by the increasing operating current can be effectively reduced to further enhance the resistance to static electricity and increase reliability.

Still another objective of the present invention is to provide a lateral current blocking light-emitting diode, in which one or more trenches formed in the device can provide the opportunity for the photons created by an active layer of the device to escape from the sidewalls of the trenches, such that the light extraction of the light-emitting diode is greatly enhanced to further increase the illuminant efficiency.

Yet another objective of the present invention is to provide a method for manufacturing a lateral current blocking light-emitting diode, which can effectively improve the illuminant efficiency decay caused by high operating power, so that the method is not only suitable for the fabrication of general light-emitting diodes, but also very suitable for the fabrication of light-emitting diodes with high operating power.

According to the aforementioned objectives, the present invention provides a lateral current blocking light-emitting diode comprising an insulating substrate, a semiconductor epitaxial structure including at least one trench, and comprising a first conductivity type semiconductor layer deposed on a portion of the insulating substrate, wherein a bottom of the trench is beneath the first conductivity type semiconductor layer to form an electrically insulating area in the semiconductor epitaxial structure, an active layer deposed on a portion of the first conductivity type semiconductor layer to expose the other portion of the first conductivity type semiconductor layer, a second conductivity type semiconductor layer deposed on the active layer, a first conductivity type electrode deposed on the exposed portion of the first conductivity type semiconductor layer, and a second conductivity type electrode deposed on a portion of the second conductivity type semiconductor layer, wherein the trench is located between the first conductivity type electrode and the second conductivity type electrode.

According to the aforementioned objectives, the present invention further provides a method for manufacturing a lateral current blocking light-emitting diode, comprising providing an insulating substrate, forming a semiconductor epitaxial structure on the insulating substrate, wherein the semiconductor epitaxial structure comprises a first conductivity type semiconductor layer, an active layer and a second conductivity type semiconductor layer stacked in sequence, removing a portion of the second conductivity type semiconductor layer and a portion of the active layer to expose a portion of the underlying first conductivity type semiconductor layer, forming at least one trench in the semiconductor epitaxial structure, wherein the trench penetrates the second conductivity type semiconductor layer, the active layer and the first conductivity type semiconductor layer, and forming a first conductivity type electrode on the exposed portion of the first conductivity type semiconductor layer and a second conductivity type electrode on a portion of the second conductivity type semiconductor layer, wherein the trench is located between the first conductivity type electrode and the second conductivity type electrode.

According to a preferred embodiment of the present invention, the trench covers the shortest distance between the first conductivity type electrode and the second conductivity type electrode to block current between the first conductivity type electrode and the second conductivity type electrode from flowing through the shortest electrically conductible path.

The shortest electrically conductible paths between the first conductivity type electrode and the second conductivity type electrode can be effectively blocked by forming at least one trench penetrating the light-emitting diode, so that the current density with uniform distribution in the semiconductor epitaxial layers can be obtained. Accordingly, when the operating current is increased, the current can uniformly spread at two sides of the current-ejecting conductivity type electrode, which can thereby prevent current from excessively concentrating in the shortest electrically conductible path and consequently degrading the quality of the device and greatly decaying the device efficiency.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention discloses a lateral current blocking light-emitting diode and a method for manufacturing the same, which can greatly enhance the uniformity of current and the light extraction rate to achieve the purpose of increasing the illuminant efficiency of the device. In order to make the illustration of the present invention more explicit and complete, the following description is stated with reference to FIGS. 4(a) through 7.

Figure 1A:
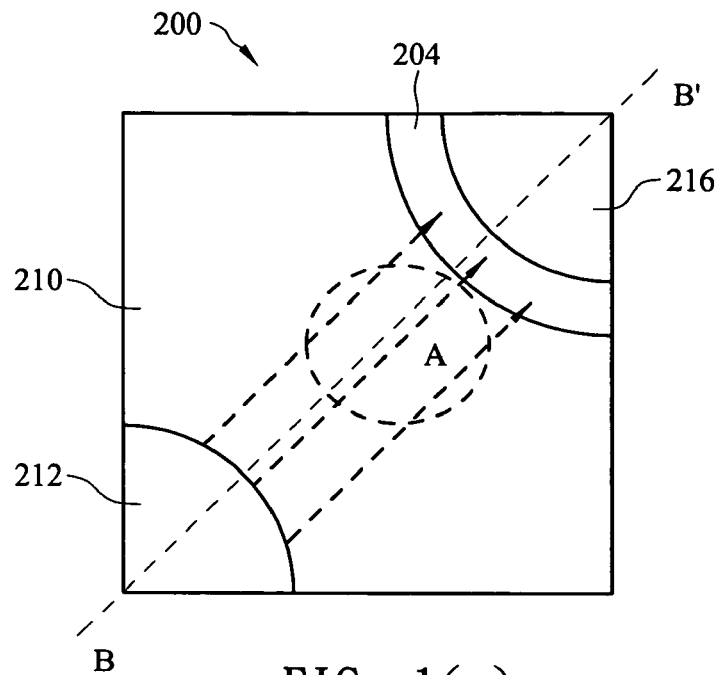
FIG. 1(a) illustrates a top view of a conventional light-emitting diode chip.
Figure 1B:
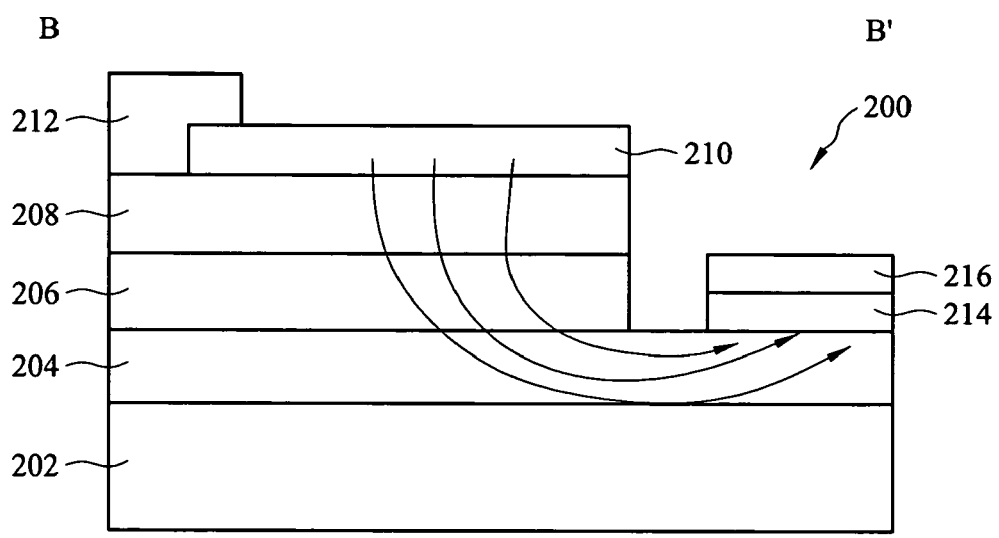
FIG. 1(b) illustrates a cross-sectional view of the light-emitting diode chip along the line B-B' shown in FIG. 1(a)
Figure 2:
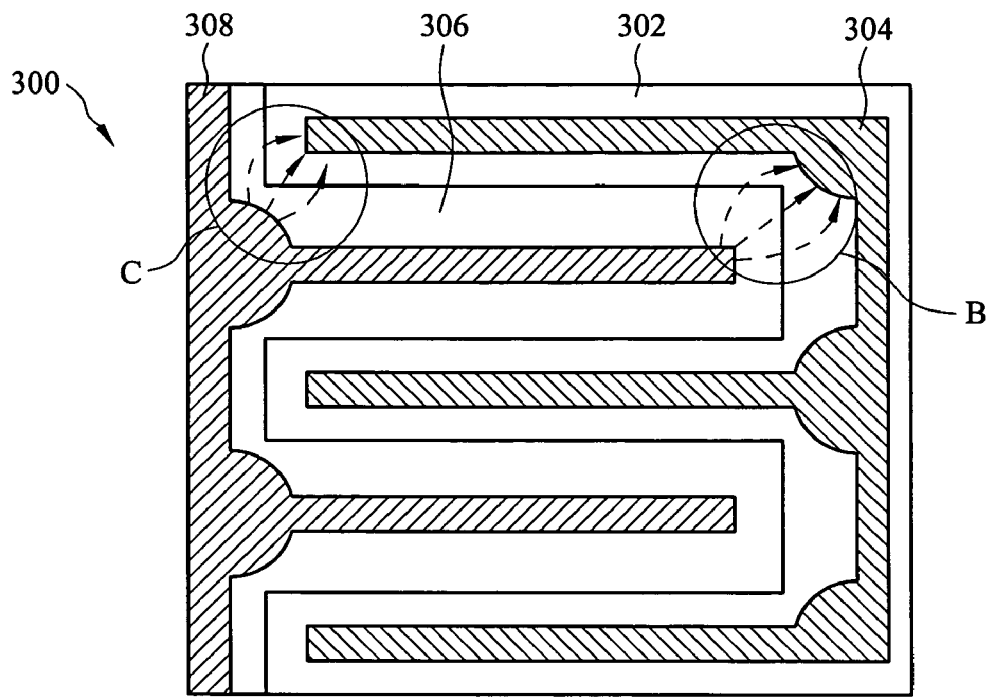
FIG. 2 illustrates a top view of a conventional light-emitting diode chip.
Figure 3:
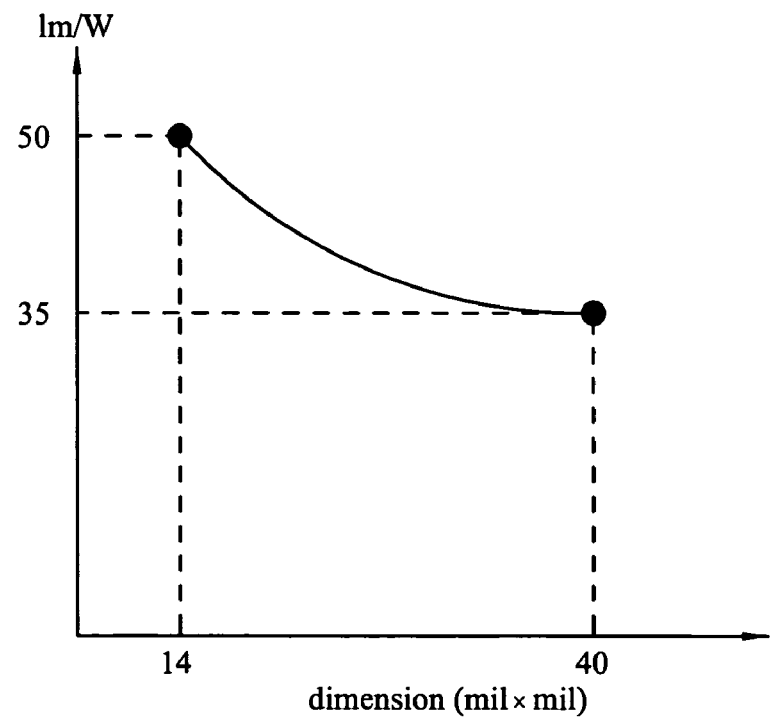
FIG. 3 illustrates a diagram showing the relationship between the dimension and the illuminant efficiency of a light-emitting diode chip.
Figure 4A:
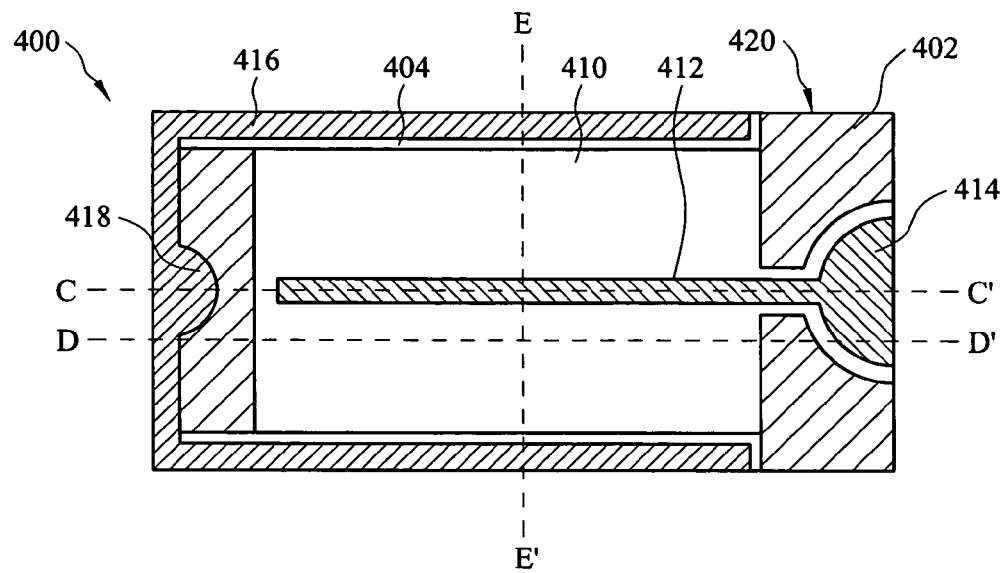
FIG. 4(a) illustrates a top view of a light-emitting diode in accordance with a first preferred embodiment of the present invention.
Figure 4B:
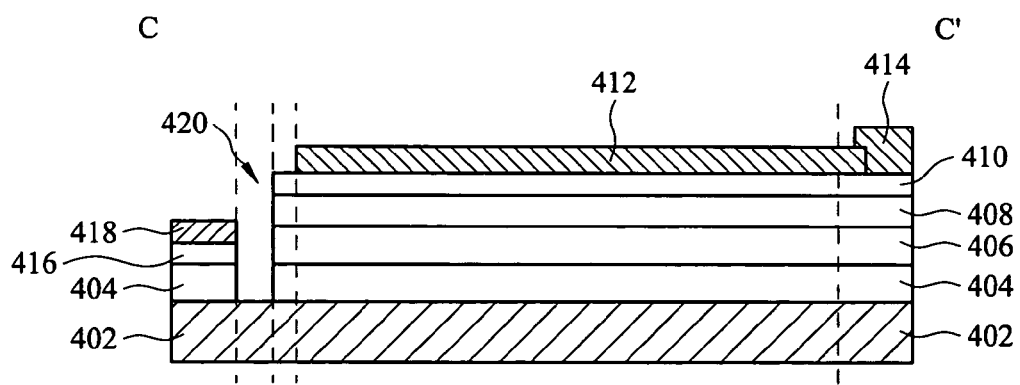
FIG. 4(b) illustrates a cross-sectional view of the light-emitting diode along the line C-C' shown in FIG. 4(a)
Figure 4C:
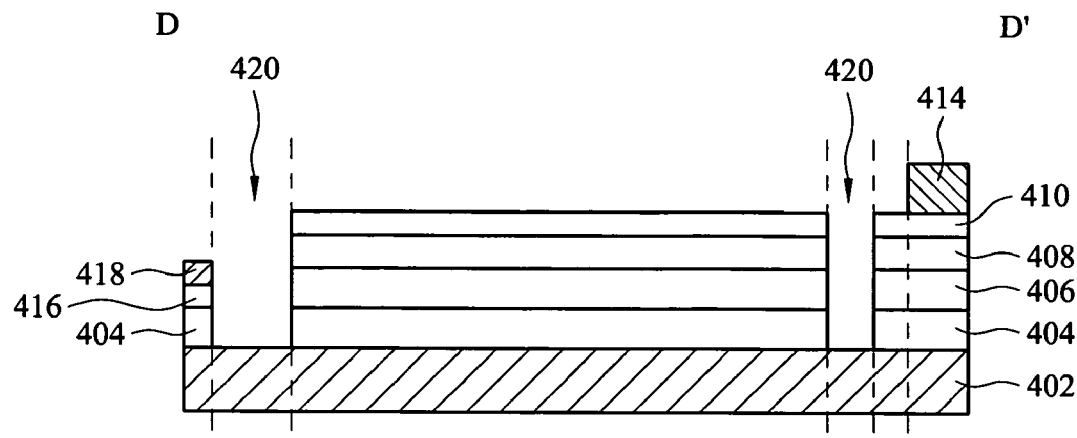
FIG. 4(c) illustrates a cross-sectional view of the light-emitting diode along the line D-D' shown in FIG. 4(a)
Figure 4D:
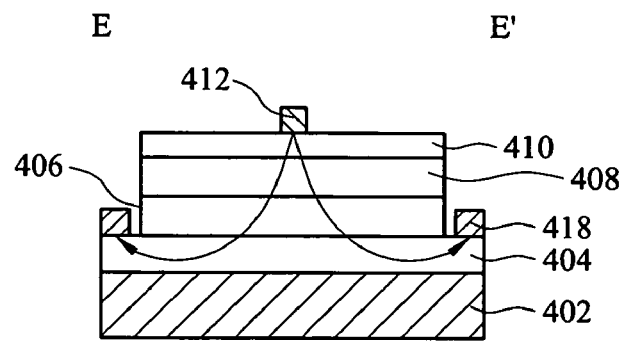
FIG. 4(d) illustrates a cross-sectional view of the light-emitting diode along the line E-E' shown in FIG. 4(a)

Referring to FIGS. 4(a) to 4(d), FIG. 4(a) illustrates a top view of a light-emitting diode in accordance with a first preferred embodiment of the present invention, and FIGS. 4(b) to 4(d) respectively illustrate a cross-sectional views of the light-emitting diode along the lines C-C', D-D' and E-E' shown in FIG. 4(a). In the fabrication of a light-emitting diode 400, a substrate 402 is provided, and a first conductivity type semiconductor layer 404, an active layer 406 and a second conductivity semiconductor layer 408 are formed on the substrate 402 in sequence by, for example, an epitaxial method, in which the first conductivity type semiconductor layer 404, the active layer 406 and the second conductivity semiconductor layer 408 comprise a semiconductor epitaxial structure. A material of the substrate 402 can be an insulating material, such as sapphire or glass. A material of the first conductivity type semiconductor layer 404 and the second conductivity semiconductor layer 408 can be, for example, a compound containing $Al_xIn_yGa_{1-x-y}N$ ($0 \leq x \leq 1$; $0 \leq y \leq 1$; $0 \leq 1-x-y \leq 1$) or a compound containing $Al_tGa_uIn_{1-t-u}P$ ($0 \leq t \leq 1$; $0 \leq u \leq 1$; $0 \leq 1 \leq t-u \leq 1$). The active layer 406 can be composed of, for example, a double heterostructure or a quantum well structure. In the other embodiments of the present invention, a buffer layer (not shown) is further formed prior to the formation of the first conductivity type semiconductor layer 404 for aiding the sequential epitaxial procedure of the semiconductor epitaxial structure. In the present invention, when the first conductivity type is N-type, the second conductivity type is P-type; conversely, when the first conductivity type is P-type, the second conductivity type is N-type.

After the second conductivity type semiconductor layer 408 is formed, a portion of the second conductivity type semiconductor layer 408 and a portion of the active layer 406 are directly removed by, for example, dry etching or wet etching, to expose a portion of the first conductivity type semiconductor layer 404, such as shown in FIG. 4(d). The exposed portion of the first conductivity type semiconductor layer 404 is provided for an electrode fabricated thereon. In the other embodiments of the present invention, the substrate 402 is not the growth substrate on which the semiconductor epitaxial structure is epitaxially formed, but instead is an insulating substrate adhered to the semiconductor epitaxial structure by, for example, sticking after the epitaxial procedure is completed and the growth substrate is removed by, for example, an etching method or a laser heating method. During the step of exposing the area of the first conductivity type semiconductor layer 404, a portion of the first conductivity type semiconductor layer 404 is usually removed for process reliability concerns. Then, another portion of the second conductivity type semiconductor layer 408, the active layer 406 and the first conductivity type semiconductor layer 404 are removed by, for example, a dry etching method or a wet etching method, to form one or more trenches 420 in the semiconductor epitaxial structure and expose the underlying substrate 402. That is, the trench 420 passes through the second conductivity type semiconductor layer 408, the active layer 406 and the first conductivity type semiconductor layer 404, and the bottom of the trench 420 is beneath the first conductivity type semiconductor layer 404, such as shown in FIGS. 4(b) and 4(c). In the other embodiments of the present invention, when a buffer layer is interposed between the first conductivity type semiconductor layer 404 and the substrate 402, the trench 420 can expose the buffer layer or the substrate 402. The amount and the shapes of the trenches 420 may be changed and modified according to the locational relation between electrodes of two different conductivity types. The trench 420 is formed between the electrodes of two different conductivity types, and the area of the trench 420 at least covers the shortest electrically conductible path between the electrodes of two different conductivity types, so as to block the current flowing between the electrodes of different conductivity types from flowing through the shortest electrically conductible path, such as shown in FIG. 4(a).

Accordingly, one feature of the present invention is that at least one trench 420 is formed in the semiconductor epitaxial structure of the light-emitting diode 400 to block the shortest electrically conductible path between the electrodes of different conductivity types, and the bottom of the trench 420 reaches to the depth beneath the first conductivity type semiconductor layer 404, so that the trench 420 forms an electrically insulating area in the semiconductor epitaxial structure. As a result, current can be effectively blocked by the trench 420, and the conductive path of the injecting current can be modified, so as to uniformly distribute current between the electrodes. Accordingly, it can prevent current from excessively concentrating on the shortest electrically conductible path between the electrodes of two different conductivity types, which can thereby enhance the device quality and prolong the device life. In addition, photons created by the active layer 406 can escape from the sidewall of the trench 420, so that the light extraction of the light-emitting diode 400 can be increased to achieve the effect of enhancing the illuminant efficiency.

After the trench 420 is formed, an insulating material (not shown) may be filled into the trench 420 to prevent a short circuit from unexpectedly occurring. The trench 420 may be filled with the insulating material by, for example, a vacuum deposition method or a coating method. The insulating material may be dielectric or organic material, in which the dielectric can be, for example, silicon nitride ($SiN_x$) or silicon oxide ($SiO_x$). Next, the electrodes can be formed immediately, or a transparent conductive layer 410 can be firstly formed on the second conductivity type semiconductor layer 408 by a deposition method to enhance the effect of spreading current. Then, a first conductivity type electrode 416 is formed on the exposed portion of the first conductivity type semiconductor layer 404, and a first conductivity type electrode pad 418 is formed on a portion of the first conductivity type electrode 416, and a second conductivity type electrode 412 and a second conductivity type electrode pad 414 are respectively formed on the transparent conductive layer 410 a portion of the second conductivity type electrode 412 and a portion of the transparent conductive layer 410 in sequence by, for example, a thermal evaporation, an e-beam evaporation or an ion sputtering method, such as shown in FIG. 4(b). The materials of the first conductivity type electrode 416, the first conductivity type electrode pad 418, the second conductivity type electrode 412 and the second conductivity type electrode pad 414 are preferably metal. For the time being, the light-emitting diode 400 is substantially completed.

Referring to FIG. 4(a) again, the first conductivity type electrode 416 is substantially C-shaped and is principally composed of a vertical portion and two horizontal portions substantially perpendicular to the vertical portion, and the second conductivity type electrode 412 is interposed between the horizontal portions of the first conductivity type electrode 416 and is parallel and equidistant to the horizontal portions of the first conductivity type electrode 416. The rear ends of the horizontal portions of the first conductivity type electrode 416 are adjacent to the second conductivity type electrode pad 414, and the rear end of the second conductivity type electrode 412 is adjacent to the first conductivity type electrode pad 418, so that the shortest electrically conductible paths between the two electrodes fall in the two regions. Accordingly, one trench 420 is installed between the first conductivity type electrode pad 418 and the second conductivity type electrode 412 and between the second conductivity type electrode pad 414 and the first conductivity type electrode 416, respectively, to block the shortest electrically conductive paths between the two electrodes. Thus, the trench 420 can prevent the current injecting from the second conductivity type electrode pad 414 from excessively concentrating in local regions, such as in the shortest electrically conductive paths between the electrodes. By properly designing the shapes and locations of the electrodes and introducing the trenches 420, the current injecting into the first conductivity type electrode 416 can be uniformly transmitted.

Figure 5:
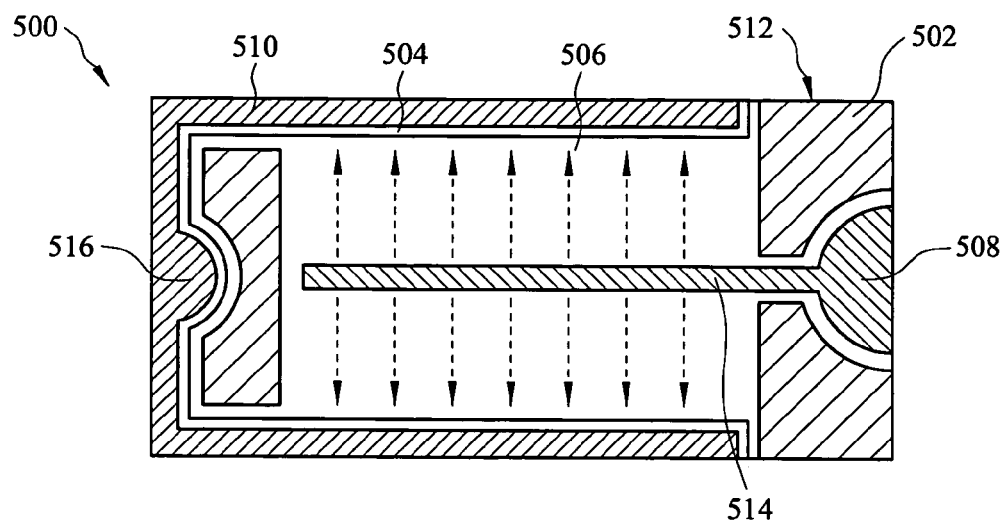
FIG. 5 illustrates a top view of a light-emitting diode in accordance with a second preferred embodiment of the present invention.

FIG. 5 illustrates a top view of a light-emitting diode in accordance with a second preferred embodiment of the present invention. The structure of a light-emitting diode 500 may be approximately the same as that of the aforementioned light-emitting diode 400. A first conductivity type electrode 510 and a first conductivity type electrode pad 516 are deposed on the exposed portion of a first conductivity type semiconductor layer 504, and a second conductivity type electrode 514 and a second conductivity type electrode pad 508 are deposed on a transparent conductive layer 506. Trenches 512 penetrate an illuminant epitaxial structure and expose an insulating substrate 502 underlying the first conductivity type semiconductor layer 504. Similar to the light-emitting diode 400, the first conductivity type electrode 510 is substantially C-shaped and is principally composed of a vertical portion and two horizontal portions substantially perpendicular to the vertical portion, and the second conductivity type electrode 514 is interposed between the horizontal portions of the first conductivity type electrode 510, in which the second conductivity type electrode 514 is parallel and equidistant to the horizontal portions of the first conductivity type electrode 510. In the light-emitting diode 500, the shortest electrically conductive paths between the electrodes fall in the regions which are between the rear ends of the horizontal portions of the first conductivity type electrode 510 and the second conductivity type electrode pad 508 and between the rear end of the second conductivity type electrode 514 and the first conductivity type electrode pad 516. Accordingly, two trenches 512 are respectively installed between the rear ends of the horizontal portions of the first conductivity type electrode 510 and the second conductivity type electrode pad 508 and between the rear end of the second conductivity type electrode 514 and the first conductivity type electrode pad 516, so as to block the shortest electrically conductive paths between the two electrodes. By properly designing the shapes and adjusting the locations of the electrodes and by introducing the trenches 512, the injecting current from the second conductivity type electrode pad 508 to the horizontal portions of the first conductivity type electrode can be uniformly transmitted. As a result, when the injecting current is increased, the current can separately flow at two sides of the second conductivity type electrode 514 to halve the current and make the current uniformly distributed at the two sides, thereby postponing the formation of a breakdown and avoiding the excessive current concentration in local areas as exhibited by the conventional light-emitting diode.

Figure 6:
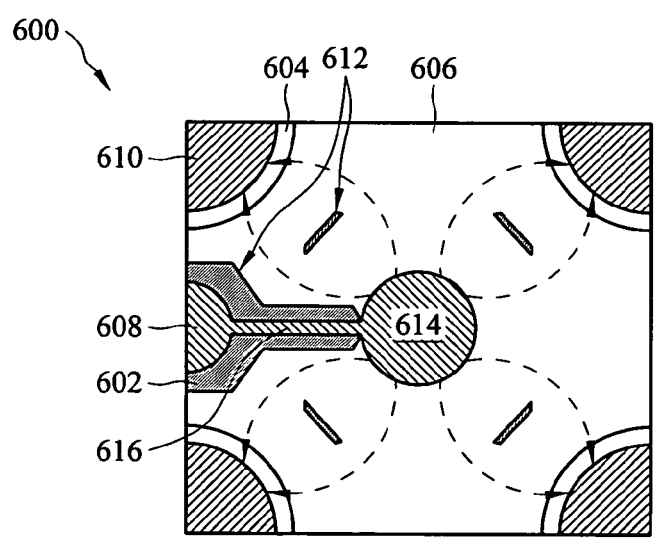
FIG. 6 illustrates a top view of a light-emitting diode in accordance with a third preferred embodiment of the present invention.

FIG. 6 illustrates a top view of a light-emitting diode in accordance with a third preferred embodiment of the present invention. The structure of a light-emitting diode 600 may also be approximately the same as that of the aforementioned light-emitting diode 400. A first conductivity type electrode 610 is deposed on the exposed portion of a first conductivity type semiconductor layer 604, and a second conductivity type electrode 614 and a second conductivity type electrode pad 608 are deposed on a transparent conductive layer 606. In the light-emitting diode 600, the second conductivity type electrode pad 608 is deposed at an edge of the light-emitting diode 600, and the second conductivity type electrode 614 is deposed at the central region of the light-emitting diode 600, in which the second conductivity type electrode pad 608 is connected with the second conductivity type electrode 614 by a connecting portion 616. The first conductivity type electrode 610 includes four parts respectively on four corners of the light-emitting diode 600. In order to block the shortest electrically conductive paths between the first conductivity type electrodes 610 and the second conductivity type electrode structure (which is composed of the second conductivity type electrode pad 608, the connecting portion 616 and the second conductivity type electrode 614), a trench 612 is formed surrounding the second conductivity type electrode pad 608 and the connecting portion 616. In addition, one trench 612 is further formed between the second conductivity type electrode 614 and each part of the first conductivity type electrode 610, such as shown in FIG. 6. The trenches 612 penetrate an illuminant epitaxial structure of the light-emitting diode 600 and expose an insulating substrate 602 underlying the first conductivity type semiconductor layer 604. The shapes and the locations of the trenches 612 are determined according to the shapes and the locations of the electrodes of the light-emitting diode 600, and current between electrodes of different conductivity types can be effectively distributed with the formation of the trenches 612.

Figure 7:
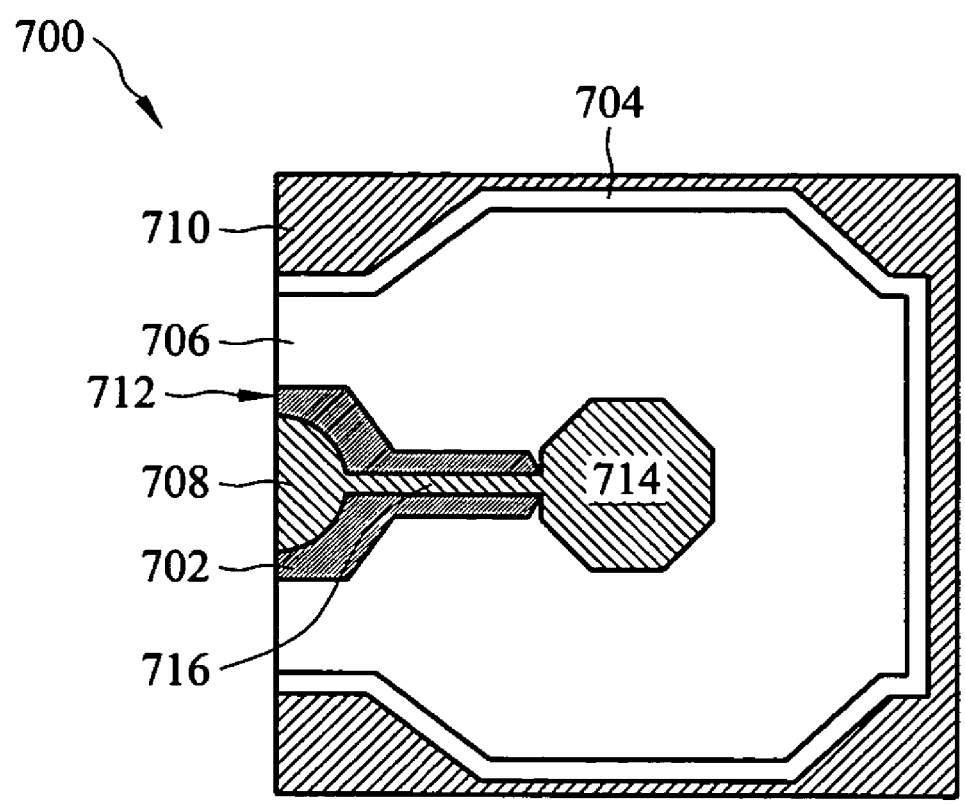
FIG. 7 illustrates a top view of a light-emitting diode in accordance with a fourth preferred embodiment of the present invention.

FIG. 7 illustrates a top view of a light-emitting diode in accordance with a fourth preferred embodiment of the present invention. Similarly, the structure of a light-emitting diode 700 may also be approximately the same as that of the aforementioned light-emitting diode 400. A first conductivity type electrode 710 is deposed on the exposed portion of a first conductivity type semiconductor layer 704, and a second conductivity type electrode 714 and a second conductivity type electrode pad 708 are deposed on a transparent conductive layer 706. A trench 712 penetrates an illuminant epitaxial structure of the light-emitting diode 700 and exposes an insulating substrate 702 underlying the first conductivity type semiconductor layer 704. In the light-emitting diode 700, the second conductivity type electrode pad 708 is deposed at one edge, and the second conductivity type electrode 714 is deposed at the central region, in which the second conductivity type electrode pad 708 is connected with the second conductivity type electrode 714 by a connecting portion 716. The first conductivity type electrode 710 is at a portion of the rim region of the light-emitting diode 700. Due to the shape of the second conductivity type electrode 714 being an octagon, the inner sides of the first conductivity type electrode 710 also are octagonal. In order to block the shortest electrically conductive paths between the first conductivity type electrodes 710 and the second conductivity type electrode structure (which is composed of the second conductivity type electrode pad 708, the connecting portion 716 and the second conductivity type electrode 714), a trench 712 is formed surrounding the second conductivity type electrode pad 708 and the connecting portion 716. The shape and the location of the trench 712 are determined according to the shapes and the locations of the electrodes of the light-emitting diode 700, and current between electrodes of different conductivity types can be effectively distributed with the formation of the trench 712.

In the present invention, the shape of the light-emitting diode chip may be a rectangle, a square or any polygon. The focus of the present invention is to use the design and the formation of the trench to achieve the objective of uniformly distributing current between the extended first conductivity type electrode and the extended second conductivity type electrode. Moreover, the shape of the trench is not limited, but the scope of the trench has to include the shortest electrically conductive path between the first conductivity type electrode and the second conductivity type electrode. In addition, the conductive path of current is restricted by the electrically insulating effect resulting from the trench formed in the light-emitting diode, so that current is spread to obtain a superior uniform effect and further enhance the illuminant efficiency of the light-emitting diode. Accordingly, the present invention is also very well suited to a high power light-emitting diode.

According to the aforementioned description, one advantage of the present invention is that the present lateral current blocking light-emitting diode includes at least one trench having an electrically insulating effect, so that the conductive path of injecting current can be modified for spreading current. Therefore, the present light-emitting diode has an advantage of having highly uniform current, which thereby prolongs the life of the device, greatly reduces the decay of the illuminant efficiency caused by the increasing operating current, enhances the efficiency, increases the resistance to static electricity and improves the reliability of the light-emitting diode.

According to the aforementioned description, another advantage of the present invention is that the formation of one or more trenches can provide the opportunity for the photons created by an active layer to escape from the sidewalls of the trenches, greatly enhancing the illuminant efficiency by increasing the light extraction of the light-emitting diode.

According to the aforementioned description, a further advantage of the present invention is that the decay of the illuminant efficiency caused by the high operating power can be effectively reduced by forming one or more trenches in a light-emitting diode, so that the method is not only suitable for the fabrication of general light-emitting diodes, but also very suitable for the fabrication of light-emitting diodes with high operating power.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A light-emitting diode, comprising:
   an insulating substrate;
   a semiconductor epitaxial structure, wherein the semiconductor epitaxial structure comprises:
      a first conductivity type semiconductor layer formed on a portion of the insulating substrate;
      an active layer formed on a portion of the first conductivity type semiconductor layer to expose the other portion of the first conductivity type semiconductor layer; and
      a second conductivity type semiconductor layer formed on the active layer;
   a first electrode formed on the exposed portion of the first conductivity type semiconductor layer;
   a second electrode formed on a portion of the second conductivity type semiconductor layer, electrically coupled to the first electrode; and
   at least one trench enclosed by the semiconductor epitaxial structure and penetrating through the semiconductor epitaxial structure to form an electrically insulating area such that current is laterally spread within the semiconductor epitaxial structure, wherein the bottom of the trench exposes the insulating substrate.

2. The light-emitting diode according to claim 1, wherein the semiconductor epitaxial structure further comprises a buffer layer interposed between the first conductivity type semiconductor layer and the insulating substrate.

3. The light-emitting diode according to claim 1, wherein a material of the insulating substrate is selected from the group consisting of sapphire and glass.

4. The light-emitting diode according to claim 1, wherein a material of the first conductivity type semiconductor layer and a material of the second conductivity type semiconductor layer are selected from the group consisting of compounds containing $Al_xIn_yGa_{1-x-y}N$ ($0 \leq x \leq 1$; $0 \leq y \leq 1$; $0 \leq 1-x-y \leq 1$) and compounds containing $Al_tGa_uIn_{1-t-u}P$ ($0 \leq t \leq 1$; $0 \leq u \leq 1$; $0 \leq 1-t-u \leq 1$).

5. The light-emitting diode according to claim 1, further including an insulating layer filled into the trench.

6. The light-emitting diode according to claim 5, wherein a material of the insulating layer is selected from the group consisting of a dielectric material and an organic material.

7. The light-emitting diode according to claim 6, wherein the dielectric material is selected from the group consisting of silicon nitride ($SiN_x$) and silicon oxide ($SiO_x$).

8. The light-emitting diode according to claim 1, wherein the first conductivity type is P-type, and the second conductivity type is N-type.

9. The light-emitting diode according to claim 1, wherein the first conductivity type is N-type, and the second conductivity type is P-type.

10. The light-emitting diode according to claim 1, further comprising a transparent conductive layer interposed between the second conductivity type semiconductor layer and the second electrode.

11. A light-emitting diode, comprising:
    an insulating substrate;
    a semiconductor epitaxial structure, wherein the semiconductor epitaxial structure comprises:
       a first conductivity type semiconductor layer formed on a portion of the insulating substrate;
       an active layer formed on a portion of the first conductivity type semiconductor layer to expose the other portion of the first conductivity type semiconductor layer; and
       a second conductivity type semiconductor layer formed on the active layer;
    a first electrode formed on the exposed portion of the first conductivity type semiconductor layer;
    a second electrode formed on a portion of the second conductivity type semiconductor layer, electrically coupled to the first electrode; and
    at least one trench, surrounded by the semiconductor epitaxial structure, positioned in a path having the shortest distance between the first electrode and the second electrode, wherein the bottom of the trench exposes the insulating substrate.

12. The light-emitting diode according to claim 11, wherein the semiconductor epitaxial structure further comprises a buffer layer interposed between the first conductivity type semiconductor layer and the insulating substrate.

13. The light-emitting diode according to claim 11, wherein a material of the insulating substrate is selected from the group consisting of sapphire and glass, and a material of the first conductivity type semiconductor layer and a material of the second conductivity type semiconductor layer are selected from the group consisting of compounds containing $Al_xIn_yGa_{1-x-y}N$ ($0 \leq x \leq 1$; $0 \leq y \leq 1$; $0 \leq 1-x-y \leq 1$) and compounds containing $Al_tGa_uIn_{1-t-u}P$ ($0 \leq t \leq 1$; $0 \leq u \leq 1$; $0 \leq 1-t-u \leq 1$).

14. The light-emitting diode according to claim 11, further including an insulating layer filled into the trench, and a material of the insulating layer is selected from the group consisting of a dielectric material and an organic material.

15. A method for manufacturing a light-emitting diode, comprising:
    providing an insulating substrate;
    forming a semiconductor epitaxial structure on the insulating substrate, wherein the semiconductor epitaxial structure comprises a first conductivity type semiconductor layer, an active layer and a second conductivity type semiconductor layer stacked in sequence;

removing a portion of the second conductivity type semiconductor layer and a portion of the active layer to expose a portion of the underlying first conductivity type semiconductor layer;

forming at least one trench that is enclosed by and penetrates the semiconductor epitaxial structure to form an electrically insulating area such that current is laterally spread within the semiconductor epitaxial structure, wherein a bottom of the trench exposes the insulating substrate; and forming a first electrode on the exposed portion of the first conductivity type semiconductor layer and a second electrode on a portion of the second conductivity type semiconductor layer, electrically coupled to the first electrode.

16. The method for manufacturing a light-emitting diode according to claim 15, wherein the semiconductor epitaxial structure further comprises a buffer layer interposed between the first conductivity type semiconductor layer and the insulating substrate.

17. The method for manufacturing a light-emitting diode according to claim 15, wherein after the step of forming the trench, further comprises forming an insulating layer to fill into the trench, and a material of the insulating layer is selected from the group consisting of a dielectric material and an organic material.

18. The method for manufacturing a light-emitting diode according to claim 15, wherein the scope of the trench at least covers a shortest electrically conductive path between the first electrode and the second electrode to block current between the first electrode and the second electrode from flowing through the shortest electrically conductive path.

19. The method for manufacturing a light-emitting diode according to claim 15, wherein a material of the first electrode and a material of the second electrode are metal.

* * * * *